(12) United States Patent
Barnett et al.

(10) Patent No.: US 8,669,758 B2
(45) Date of Patent: Mar. 11, 2014

(54) AC VOLTAGE MEASUREMENT CIRCUIT

(71) Applicant: Broadcom Corporation, Irvine, CA (US)

(72) Inventors: Iain Barnett, Lasswade (GB); William Michael James Holland, Edinburgh (GB); Jonathan Ephraim David Hurwitz, Edinburgh (GB)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/949,031

(22) Filed: Jul. 23, 2013

(65) Prior Publication Data

US 2013/0314108 A1    Nov. 28, 2013

Related U.S. Application Data

(63) Continuation of application No. 13/106,720, filed on May 12, 2011, now Pat. No. 8,493,056.

(30) Foreign Application Priority Data

May 12, 2010  (GB) .................................... 1007892.1
May 12, 2010  (GB) .................................... 1007896.2

(51) Int. Cl.
*G01R 19/00*   (2006.01)

(52) U.S. Cl.
USPC ......................................................... 324/76.11

(58) Field of Classification Search
USPC .................. 324/76.11, 762.01–762.1; 257/48; 438/14–18
See application file for complete search history.

(56) References Cited

U.S. PATENT DOCUMENTS 7,923,983 B2 *   4/2011   Fornage ...................... 324/76.11
8,274,304 B2 *   9/2012   Kuo ........................... 324/764.01

* cited by examiner

*Primary Examiner* — Tung X Nguyen
(74) *Attorney, Agent, or Firm* — Garlick & Markison; Bruce E. Garlick

(57) ABSTRACT

A voltage measurement circuit is operative to measure a high voltage AC signal and includes a capacitive divider circuit and a compensator circuit. The capacitive divider circuit includes first and second inputs, across which, in use, is received a high voltage AC signal and also includes second and third capacitors. First and second plates of each of the first, second and third capacitors are defined by conductive layers of a printed circuit board and the dielectric of each of the first, second and third capacitors being defined by a non-conducting part of the printed circuit board. A compensator circuit has a configurable transfer function and includes an input connected across the first and second plates of the third capacitor and an output. The compensator circuit is operative to change a voltage received at its input in accordance with the transfer function and to provide the changed voltage at its output.

20 Claims, 8 Drawing Sheets

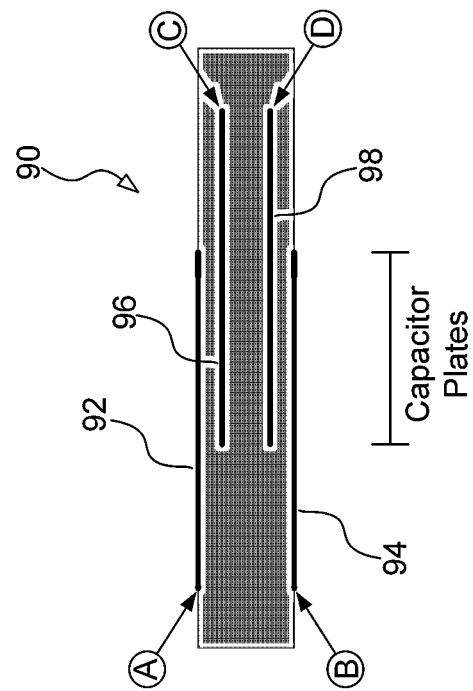
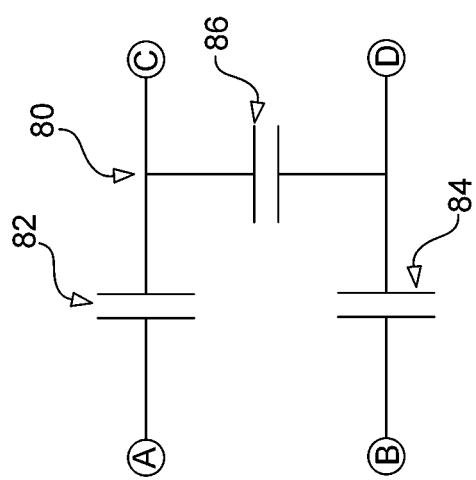
*Figure 4B*
*Figure 4A*

AC VOLTAGE MEASUREMENT CIRCUIT

CROSS-REFERENCE TO PRIORITY APPLICATION

This application is a continuation of U.S. application Ser. No. 13/106,720, filed May 12, 2011, and now issued as U.S. Pat. No. 8,493,056, which claims priority under 35 U.S.C. §119(a) to Great Britain Application Serial No. GB1007892.1 filed May 12, 2010 and to Great Britain Application Serial No. GB1007896.2 filed May 12, 2010, both of which are incorporated herein by reference in their entirety for all purposes.

FIELD OF THE INVENTION

The present invention relates to a method of measuring a high voltage AC signal; and more particularly to a voltage measurement circuit operative to measure a high voltage AC signal.

DESCRIPTION OF THE RELATED ART

It is known to measure AC voltages by means of a capacitive divider circuit. In such a known circuit, first, second and third series connected capacitors form a capacitor chain and the values of the capacitors are chosen to reduce the level of an AC voltage applied across the capacitor chain to a level across the centre-most capacitor that is compatible with lower voltage electronic circuits. For example, the lower voltage electronic circuits may comprise an analogue to digital converter and subsequent digital processing circuits. Hence, the values of the first to third capacitors may, for example, be chosen to reduce a voltage swing of 230 Vrms across the capacitor chain to a voltage swing of about 3 volts across the centre-most capacitor.

There are shortcomings with capacitive divider circuits used to measure AC voltages when the capacitors of a capacitive divider circuit are formed as part of a printed circuit board. More specifically, shortcomings arise when the plates of the capacitors are defined by conductive layers of a printed circuit board and the dielectric of the capacitors is defined by a non-conducting part of the printed circuit board.

BRIEF DESCRIPTION OF THE DRAWINGS

Further features and advantages of the present invention will become apparent from the following specific description, which is given by way of example only and with reference to the accompanying drawings, in which:

FIG. 4A is a circuit diagram of the capacitive divider of FIG. 2;

FIG. 4B provides a cross-section view of a printed circuit board configured to form the circuit of FIG. 4A;

DETAILED DESCRIPTION

Figure 1:
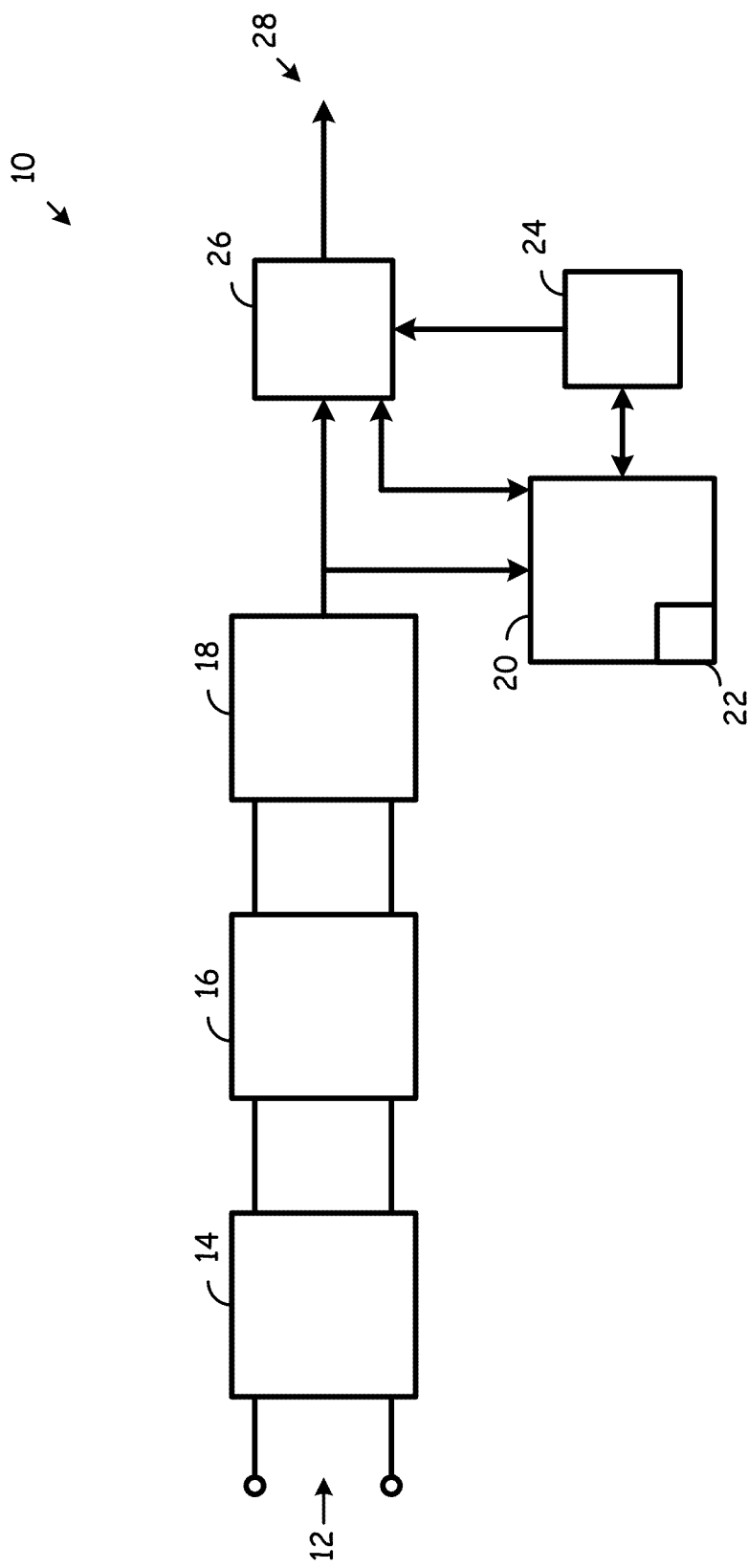
FIG. 1 is block diagram of a voltage measurement circuit according to the present invention.

According to a first aspect of the present invention a high voltage AC signal is measured with a voltage measurement circuit having a capacitive divider circuit and a compensator circuit. The capacitive divider circuit has first and second inputs and first, second and third capacitors. A first plate of the first capacitor being electrically connected to the first input and a second opposing plate of the first capacitor being electrically connected to a first plate of the third capacitor, a first plate of the second capacitor being electrically connected to the second input and a second opposing plate of the second capacitor being electrically connected to a second plate of the third capacitor, the plates of each of the first, second and third capacitors being defined by conductive layers of a printed circuit board and the dielectric of each of the first, second and third capacitors being defined by a non-conducting part of the printed circuit board. The compensator circuit has a configurable transfer function and an input electrically connected across the first and second plates of the third capacitor, and an output.

In operation a known voltage signal is applied across the first and second inputs to the capacitive divider circuit. Then, a voltage is measured across the first and second plates of the third capacitor. Next operation includes determining a transfer function that would be operative to change the measured voltage such that it corresponds to a desired voltage across the first and second plates of the third capacitor based upon relative, ideal impedances of the first, second and third capacitors. Then, operation includes configuring the compensator circuit with the determined transfer function. Finally, operation includes measuring a high voltage AC signal with the voltage measurement circuit, such that the compensator circuit is operative to change a voltage received at its input in accordance with the determined transfer function and to provide the changed voltage at its output.

In use, a known voltage signal is applied across the first and second inputs to the capacitive divider circuit and the voltage across the first and second plates of the third capacitor is measured. The measured voltage may be compared with a desired voltage based upon relative, ideal impedances of the first to third capacitors and the transfer function determined in dependence on the comparison. For example, it may be desired to have 4 volt signal across the third capacitor when a 230 Vrms signal (or 120 Vrms signal) is applied across the first and second inputs. When a 230 Vrms signal is applied across the first and second inputs, 3.2 volts may be measured across the third capacitor. Therefore, the transfer function may be determined such that the compensator circuit applies a gain of 1.25 to the voltage received at its input to provide a changed voltage of 4 volts at its output.

The impedance values of the first to third capacitors are selected to effect a desired voltage division. However, one or more of a number of variations in printed circuit board manufacture may cause the actual values of the impedances of the first to third capacitors to depart from the ideal values required to effect the desired voltage division. Such variations may be in respect of: the area of metal used to define the plates of the capacitors; the dielectric constant of the non-conducting part of the printed circuit board used to define the dielectric of the capacitors; and the thickness of the non-conducting part of the printed circuit board used to define the dielectric of the capacitors. Because printed circuit board manufacture involves forming the dielectrics and pairs of plates of the capacitors at difference stages and it can be difficult to match the dielectrics and pairs of plates accurately. Thus, it can be difficult to control the dielectric constant of the non-conducting part of the printed circuit board so as to provide for accuracy of matching from capacitor to capacitor.

More specifically, the method may include determining the transfer function in dependence on solely one applied known voltage and corresponding measurement across the first and second plates of the third capacitor. Thus, the transfer function may be operative to apply solely a gain to a measured high voltage AC signal. The solely one applied known voltage may be a maximum or near maximum voltage, e.g. 230 Vrms.

Alternatively or in addition, the method may include determining the transfer function in dependence on two applied known voltages of different levels and respective corresponding measurements across the first and second plates of the third capacitor. Thus, the transfer function may be operative to apply an offset and a gain to a measured high voltage AC signal. A first of the two known voltages may be a maximum or near maximum voltage. A second of the two known voltages may be a minimum or near minimum voltage, e.g. 0 volts.

Alternatively or in addition, the method may include determining the transfer function in dependence on a plurality (e.g. more than two) of applied known voltages of different levels and respective corresponding measurements across the first and second plates of the third capacitor. Thus, for example, the transfer function may be operative to provide for correction of offset, gain, non-linearity and perhaps also noise. The transfer function may be determined on the basis of the plurality of measurements such that it has the form of a second or higher degree polynomial.

Alternatively or in addition, the capacitive divider circuit may be configured to operate as a DC isolator. Thus, the capacitive divider circuit may be operative to provide DC isolation between a high voltage input stage and a low voltage output stage with the first and second capacitors forming an isolation barrier.

Alternatively or in addition, the voltage measurement circuit may include a differential active circuit having first and second differential inputs and outputs with a first differential input electrically connected to the first plate of the third capacitor and a second differential input electrically connected to the second plate of the third capacitor. Therefore, the method may include applying a known voltage across the first and second inputs to the capacitive divider and measuring a voltage in dependence thereon across the first and second differential outputs from the active circuit. Thus, the voltage across the first and second plates of the third capacitor may be measured across the differential outputs of the active circuit instead of directly across the first and second plates of the third capacitor.

More specifically, the differential active circuit may include at least one of a buffer and an amplifier. In use, the step of determining the transfer function may take account of inaccuracies in the active circuit in addition to or instead of inaccuracies in the capacitive divider. For example, it may be difficult to define and control the input impedance of the active circuit; departure from an ideal input impedance is liable to adversely affect the division ratio of the capacitance divider. Also, for example, the gains of different active circuits are liable to differ with departure from a desired gain adversely affecting measured voltages.

Alternatively or in addition, the compensator circuit may include an analogue to digital converter that is operative to convert a voltage measured across the first and second plates of the third capacitor to a digital signal. The digital signal may, for example, be operated upon to determine the transfer function. Hence, the compensator circuit may include digital processing circuitry that is operative to determine the transfer function in dependence on at least one applied known voltage and the corresponding at least one voltage measured across the first and second plates of the third capacitor. For example, the processing circuitry may be operative to determine a first order polynomial (i.e. in respect of offset and gain) on the basis of two different applied known voltages and the corresponding measured voltages or a second or higher degree polynomial on the basis of a plurality of different applied known voltages and corresponding measured voltages.

Alternatively or in addition, the method may include storing at least one value for the transfer function in a storage device. The storage device may be included in the compensator circuit. The storage device may be electronic memory, such as an EFUSE device or an EPROM device. Hence, the storage device may, for example, store a gain value and an offset value where the transfer function is a first degree polynomial.

Alternatively or in addition, the compensator circuit may include at least one of a digital adder and a digital multiplier. The digital adder may be operative to receive a digital form of the measured voltage and to add an offset value to the digital measured voltage to thereby effect correction. The digital multiplier may be operative to receive a digital form of the measured voltage and to multiply the digital measured voltage with a gain value to thereby effect correction. Where the transfer function is of the form of a second or higher degree polynomial the digital multiplier may operative to multiply the digital form of the measured voltage with itself the requisite number of times to determine a particular term of the polynomial. For example, in a second degree polynomial the digital form of the measured voltage may be multiplied with itself once to determine the second degree term of the polynomial. Application of the transfer function may require temporary storage of terms of a polynomial before the terms are added to each other. Hence, the compensator circuit may include temporary data storage, such as RAM that might form part of a microprocessor. Each of the digital adder and the digital multiplier may receive the digital form of the measured voltage from an analogue to digital converter, which may be the same circuit that is operative to convert a voltage measured across the first and second plates of the third capacitor prior to the step of determining the transfer function.

Alternatively or in addition, the capacitive divider may be configured to receive a high voltage AC signal having a frequency of less than 500 Hz, such as a frequency of substantially 60 Hz or substantially 50 Hz for domestic mains or a frequency of substantially 400 Hz for mains in ships.

Alternatively or in addition, a high voltage AC signal in the context of the present invention may be an AC voltage of 50 Vrms or greater according to standards defined by the International Electrotechnical Commission, such as an AC voltage of substantially 110 Vrms or substantially 230 Vrms. Thus, the high voltage AC signal may be a domestic mains voltage signal or a mains voltage signal in a ship.

Alternatively or in addition, the third capacitor may be operable at a low voltage. Alternatively or in addition, a low voltage signal in the context of the present invention may be an AC voltage of less than 50 Vrms or a DC voltage of less than 120 V according to standards defined by the International Electrotechnical Commission. More specifically, the low voltage signal may be a DC voltage of less than substantially 15 volts, such as a voltage of 12 volts. More specifically, the low voltage signal may be a DC voltage of substantially 5 volts or less, such as 3 volts.

Alternatively or in addition, each of the first and second capacitors may have a capacitance of less than 100 pF. More specifically, each of the first and second capacitors may have a capacitance of less than 50 pF. More specifically, each of the first and second capacitors may have a capacitance of less than 10 pF, such as substantially 5 pF.

Alternatively or in addition, the third capacitor may have a capacitance of less than substantially 500 pF, such as substantially 200 pF. More specifically, the third capacitance may be less than substantially 200 pF, such as 15 to 20 pF. Where such a third capacitance is insufficient to achieve a desired voltage division, the DC isolator may further include at least one of a parasitic impedance, e.g. resistance and/or capacitance, and a discrete impedance, such as is provided by a discrete capacitor.

Alternatively or in addition, a plate of at least one of the first, second and third capacitors may be defined by a layer of metal in or on the printed circuit board. The layer of metal may be formed on a surface, such as an upper or lower surface of the printed circuit board. Hence, first and second plates of a capacitor may be formed on opposing upper and lower surfaces of the printed circuit board such that the non-conducting body of the printed circuit board constitutes the dielectric of the capacitor. Alternatively, at least one layer of metal may be embedded within the printed circuit board. Hence, the first and second plates of a capacitor may be formed within the printed circuit board such that they are spaced apart from each other and with their footprints overlapping, whereby a non-conducting part of the printed circuit board between the first and second plates constitutes the dielectric of the capacitor. The first and second plates may share substantially the same footprint.

Alternatively or in addition, the third capacitor may include at least in part a discrete capacitor, such as a ceramic capacitor.

Alternatively or in addition, the third capacitor may be a parasitic capacitance. The parasitic capacitance may be formed by an input to an electrical device or circuit connected to the first and second capacitors, such as the differential active circuit. Alternatively or in addition, the parasitic capacitance may be present in and hence formed by the printed circuit board.

In a form of one or more embodiments of the invention, the first plate of the first capacitor may be defined by a first surface layer on a first surface of the printed circuit board, the first plate of the second capacitor may be defined by a second surface layer on a second opposite surface of the printed circuit board, the second plate of the first capacitor may be defined by a first embedded layer within the printed circuit board and the second plate of the second capacitor may be defined by a second embedded layer having a footprint that overlaps a footprint of the first embedded layer, the first and second embedded layers being spaced apart from each other. Footprints of the first and second surface layers may at least partially overlap the footprints of the first and second embedded layers. Also, the second plate of the first capacitor may be closer to the first plate of the first capacitor than the second plate of the second capacitor. Thus, a first plate of the third capacitor may be defined by the first embedded layer and the second plate of the third capacitor may be defined by the second embedded layer with a dielectric of the third capacitor being defined by a non-conducting part of the printed circuit board between the first and second embedded layers. The first and second embedded layers may be spaced apart from each other to an extent less than a spacing between each of the first surface layer and the first embedded layer and of the second surface layer and the second embedded layer. Hence, the third capacitor may have a larger capacitance than each of the first capacitor and the second capacitor.

Alternatively or in addition, the voltage measurement circuit may further include a rectification circuit, such as a diode or a bridge rectifier, which is operative to rectify a high voltage AC signal before it reaches the capacitance divider.

Alternatively or in addition, the voltage measurement circuit may further include a resistive divider operative to reduce a voltage level of a high voltage AC signal applied to the capacitance divider.

Alternatively or in addition, the voltage measurement circuit may further include an electrical source that is operative to provide a high voltage AC signal to the capacitance divider. The electrical source may, for example, be an electrical tap taken from a mains power supply.

According to a second aspect of the present invention a voltage measurement circuit operative to measure a high voltage AC signal. The voltage measurement circuit has a capacitive divider circuit and a compensator circuit. The capacitive divider circuit has first and second inputs, across which, in use, is received a high voltage AC signal; and first, second and third capacitors, a first plate of the first capacitor being electrically connected to the first input and a second opposing plate of the first capacitor being electrically connected to a first plate of the third capacitor, a first plate of the second capacitor being electrically connected to the second input and a second opposing plate of the second capacitor being electrically connected to a second plate of the third capacitor, the first and second plates of each of the first, second and third capacitors being defined by conductive layers of a printed circuit board and the dielectric of each of the first, second and third capacitors being defined by a non-conducting part of the printed circuit board. The compensator circuit has a configurable transfer function and has an input electrically connected across the first and second plates of the third capacitor and an output. The compensator circuit is operative to change a voltage received at its input in accordance with the transfer function and to provide the changed voltage at its output.

Embodiments of the second aspect of the present invention may include one or more features of the first aspect of the present invention.

According to a further aspect of the present invention a method of measuring a high voltage AC signal is performed by a voltage measurement circuit and includes applying a known voltage signal across the first and second inputs to the capacitive divider circuit. The method then includes measuring a voltage signal across the first and second plates of the third capacitor, determining a transfer function that would be operative to change the measured voltage such that it corresponds substantially to a desired voltage across the first and second plates of the third capacitor based upon relative impedances of the first, second and third capacitors, configuring the compensator circuit with the determined transfer function, and measuring a high voltage AC signal with the voltage measurement circuit, such that the compensator circuit is operative to change a voltage received at its input in accordance with the determined transfer function and to provide the changed voltage at its output.

More specifically, the plates of at least one of the first, second and third capacitors may be defined by conductive layers of a printed circuit board and the dielectric of each of the first, second and third capacitors may be defined by a non-conducting part of the printed circuit board Alternatively or in addition, at least one of the first, second and third capacitors may be a discrete component. More specifically, the first and second capacitors may be class X capacitors or class Y capacitors. The third capacitor may be a ceramic capacitor.

FIG. 1 illustrates a voltage measurement circuit 10 according to the present invention. The voltage measurement circuit 10 includes first and second inputs 12, which are configured to receive a high voltage AC signal, such as a 230 Vrms mains signal, a capacitive divider 14, which is described in more detail below with reference to FIG. 2, a buffer 16 (which constitutes a differential active circuit) and an analogue to digital converter 18. As will become clear from the description below, the capacitive divider is operative to reduce the high voltage AC signal to a voltage level that is compatible with electronic processing circuitry, such as a level of about 3 volts. The reduced voltage is buffered by the buffer 16 before being converted to a digital form by the analogue to digital converter 18. The voltage measurement circuit 10 also includes a microprocessor 20, which is of known form and function and which in turn includes temporary working memory 22 in the form of RAM, one time programmable memory 24, such as an EFUSE device, and a digital multiplier and adder circuit 26. The voltage measurement circuit 10 is configured such that the microprocessor 20 receives a measured voltage in digital form from the analogue to digital converter 18 and is operative to generate digital values of a transfer function, which are stored in the one time programmable memory 24. As will become clear from the description below, the transfer function is operative to provide for compensation of inaccuracies in the voltage measurement circuit 10, which would otherwise give rise to inaccurate measurement of high voltage signals. Under the control of the microprocessor 20, the digital values of the transfer function that are stored in the one time programmable memory 24 are operated upon by the digital multiplier and adder circuit 26 along with measured voltage signals in digital form received from the analogue to digital converter 18 to provide compensated measured voltage signals at the output 28 from the digital multiplier and adder circuit 26.

Figure 2:
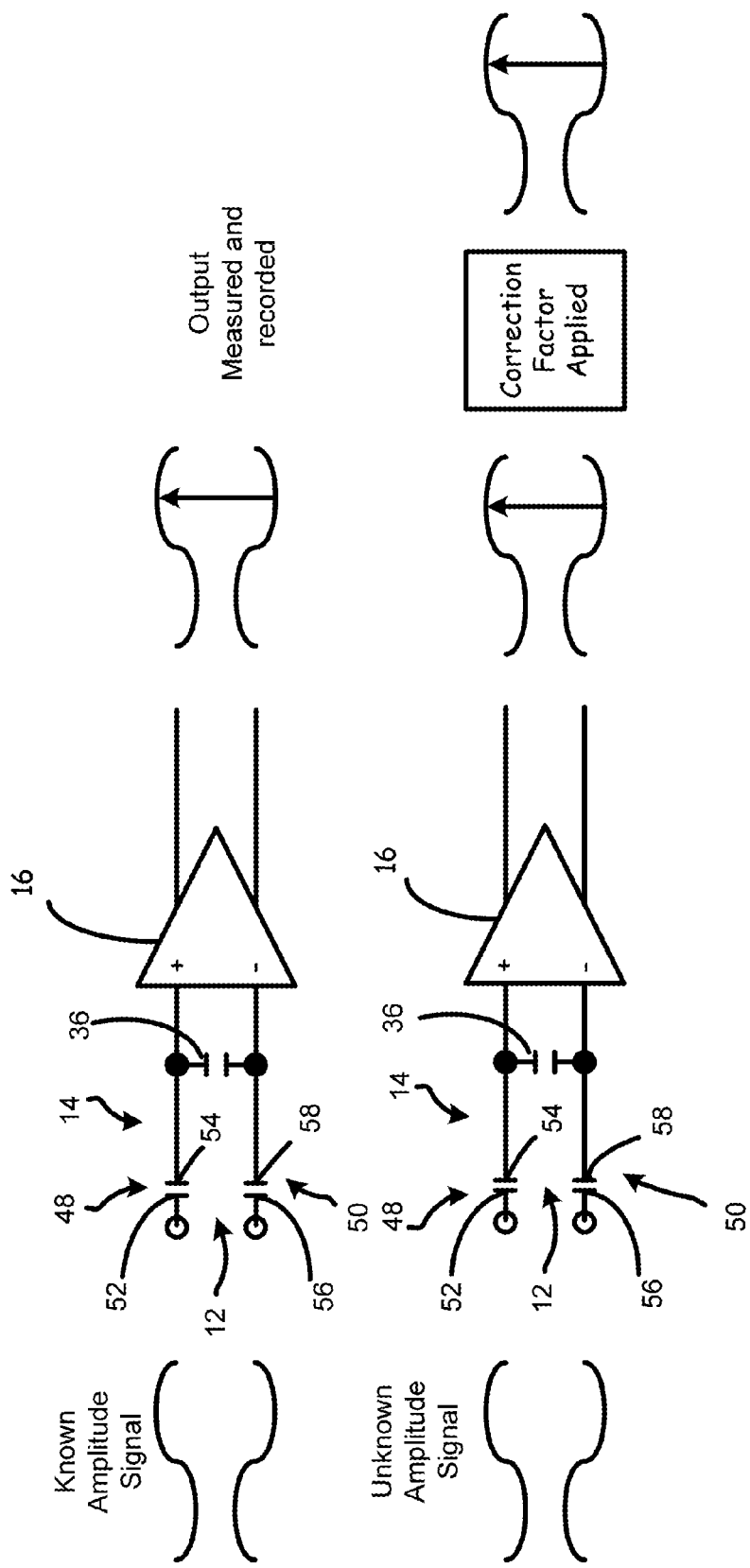
FIG. 2 is a circuit diagram of the capacitive divider and buffer of FIG. 1.

FIG. 2 illustrates a circuit diagram of the capacitive divider 14 and differential buffer 16 of FIG. 1. Certain input and output wave forms are also shown in FIG. 2; these waveforms will be referred to in the description given below with reference to FIG. 8. The capacitive divider 14 is in the form of first 48, second 50 and third 36 series connected capacitors. A first plate 52 of the first capacitor 48 is electrically connected to a first, positive input from a high voltage AC source (not shown) and a second plate 54 of the first capacitor is electrically connected to a first plate of the third capacitor 36 and to the non-inverting input of the buffer 16. A first plate 56 of the second capacitor 50 is electrically connected to a second, negative input from the high voltage AC source and a second plate 58 of the second capacitor is electrically connected to a second plate of the third capacitor 36 and to the inverting input of the buffer 16. Hence, an AC voltage signal applied across the first and second inputs 12 is divided such that a reduced voltage is developed across the third capacitor 36 with the reduced voltage across the third capacitor 36 being buffered by the differential buffer 16 for subsequent processing. The extent to which the capacitive divider 14 is operative to divide the AC voltage signal is determined by the relative values of the capacitances of the first to third capacitors. In the present example, where a domestic mains voltage signal of 230 Vrms at 50 Hz is applied at the inputs 12, a value of substantially 5 pF is used for each of the first and second capacitors and a value of substantially 200 pF is used for the third capacitor to provide a reduced voltage of about 3 volts. As can be appreciated from FIG. 2, the first and second capacitors 48, 50 form a DC isolation barrier such that the low voltage circuitry, i.e. the buffer 16 and subsequent processing circuitry, is isolated from the high voltage side.

Figure 3:
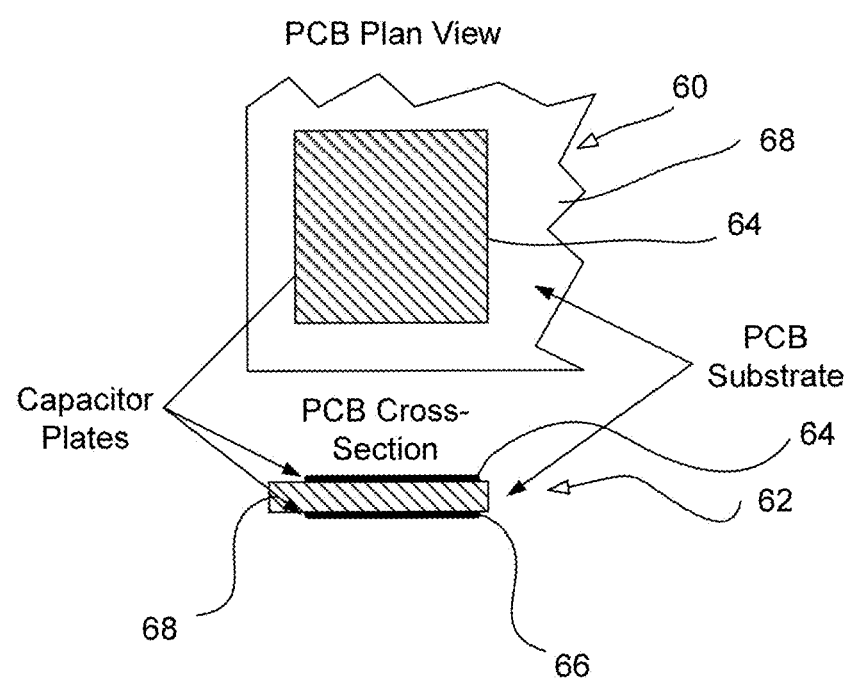
FIG. 3 provides plan and cross-section views of a printed circuit board configured to form part of the capacitive divider of FIG. 2.

FIG. 3 are plan 60 and cross-section 62 views of one of the first 48, second 50 and third 36 capacitors of FIG. 2. Each of the first 64 and second 66 plates of the capacitor are defined by respective metal layers on the top and bottom surfaces of the printed circuit board. The metal layers are disposed such that they share the same footprint and so that the non-conductive substrate 68 of the printed circuit board defines the dielectric of the capacitor. The formation of metal tracks and of larger area structures, such the metal layers of the first and second plates, on a printed circuit board substrate is a process that is well known to the skilled person. Alternatively, one or more capacitor plates are defined by metal layers embedded within the substrate. The provision of embedded metal tracks and of larger area structures, such as the metal layers of the first and second plates, is a process that is well known to the skilled person. An application of embedded metal layers is described below with reference to FIGS. 4A and 4B.

FIG. 4A illustrates a capacitive divider 80 having first 82, second 84 and third 86 capacitors. The cross section view of the printed circuit board 90 shown in FIG. 4B, the first plate of the first capacitor 82 is defined by a first surface layer 92 on a first surface of the printed circuit board 90. The first plate of the second capacitor 84 is defined by a second surface layer 94 on a second opposite surface of the printed circuit board 90. The second plate of the first capacitor 82 is defined by a first embedded layer 96 within the printed circuit board and the second plate of the second capacitor is defined by a second embedded layer 98 having a footprint that overlaps a footprint of the first embedded layer. The first and second embedded layers 96, 98 are spaced apart from each other. Footprints of the first and second surface layers 92, 94 partially overlap the footprints of the first and second embedded layers 96, 98. Also, the second plate of the first capacitor 96 is closer to the first plate of the first capacitor 92 than the second plate of the second capacitor 98 is to the first plate of the first capacitor 92. Thus, the third capacitor 86 includes first and second plates defined by the first and second embedded layers 96, 98 with the dielectric being defined by the part of the substrate between the first and second embedded layers 96, 98. The first 96 and second 98 embedded layers are spaced apart from each other to an extent less than a spacing between each of the first surface layer 92 and the first embedded layer 96 and of the second surface layer 94 and the second embedded layer 98. Hence, the third capacitor 86 has a larger capacitance than each of the first capacitor and the second capacitor. As described above, the object is to reduce the mains voltage signal of 230 Vrms to a swing of about 3 volts. A value of substantially 5 pF is used for each of the first and second capacitors.

In one form, a printed circuit board formed according to normal production practices provides a third capacitance of substantially 15pF to substantially 20 pF. Hence, the required 200 pF capacitance is achieved by using at least one of a parasitic component and an additional discrete component, such as a surface mounted capacitor, diode, etc. Where a parasitic component is used it may be in the form of at least one of parasitic capacitance and parasitic resistance. For example, if a parasitic resistance of 10M Ohms is used with first and second capacitance of 5 pF, the cut-off frequency (3 dB point) is about 3 kHz. Assuming a roll-off of 20 dB per decade, 50 Hz takes us two decades down. Hence, there is a division of about 100 at 50 Hz. The values for the capacitance and resistance can be changed in accordance with ordinary design practice to achieve a desired division factor and to operate with a specific mains frequency. In another form, the normal printed circuit board manufacturing process is modified, e.g. by increasing the number of layers or by including special thinned layers, etc., to thereby increase the third capacitance and decrease the capacitance of the first and second capacitors. Hence, the relative capacitance values can be determined to effect a desired voltage division.

Figure 5:
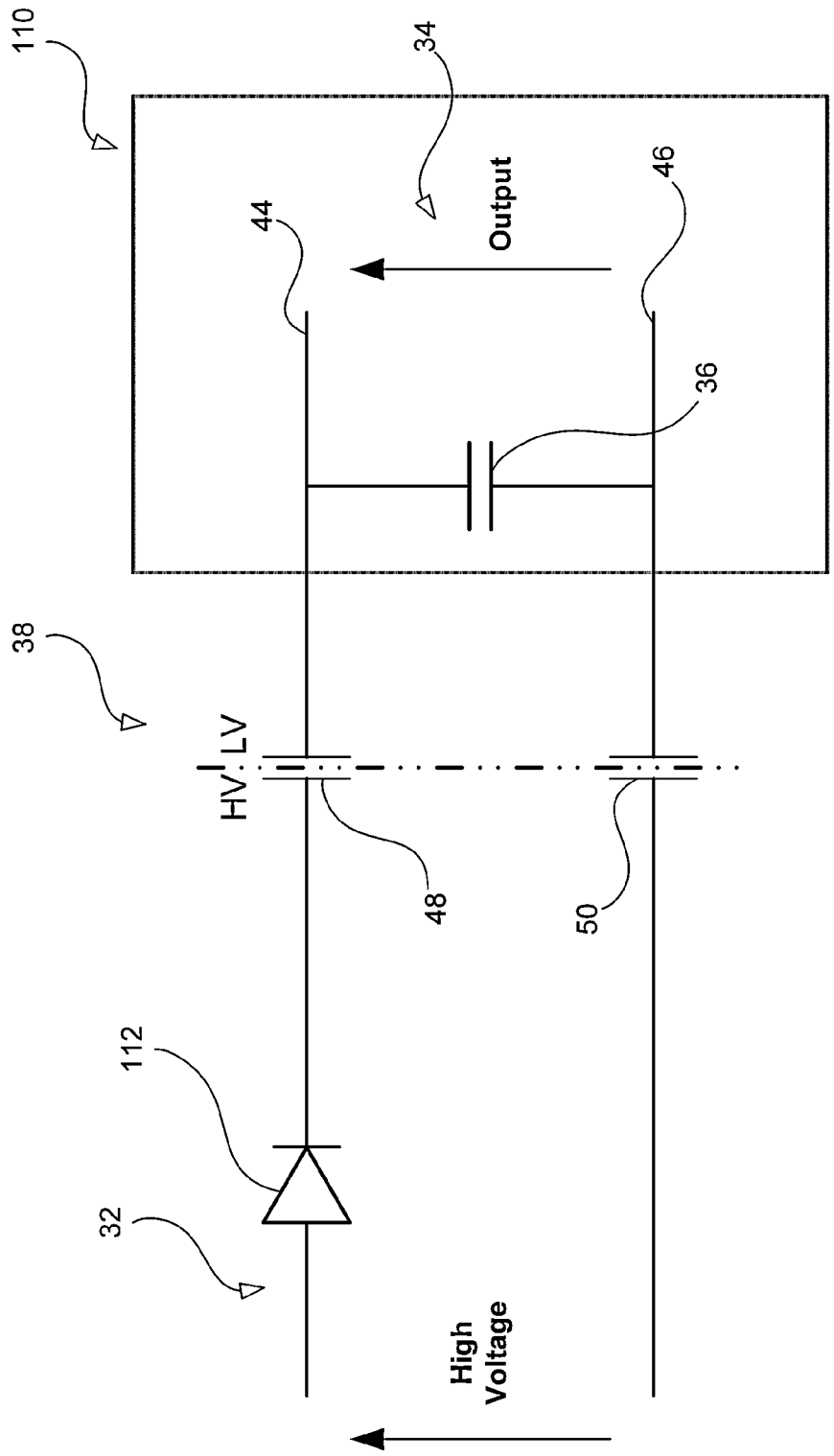
FIG. 5 is a circuit diagram of a voltage measurement circuit having a first form of input stage.
Figure 6:
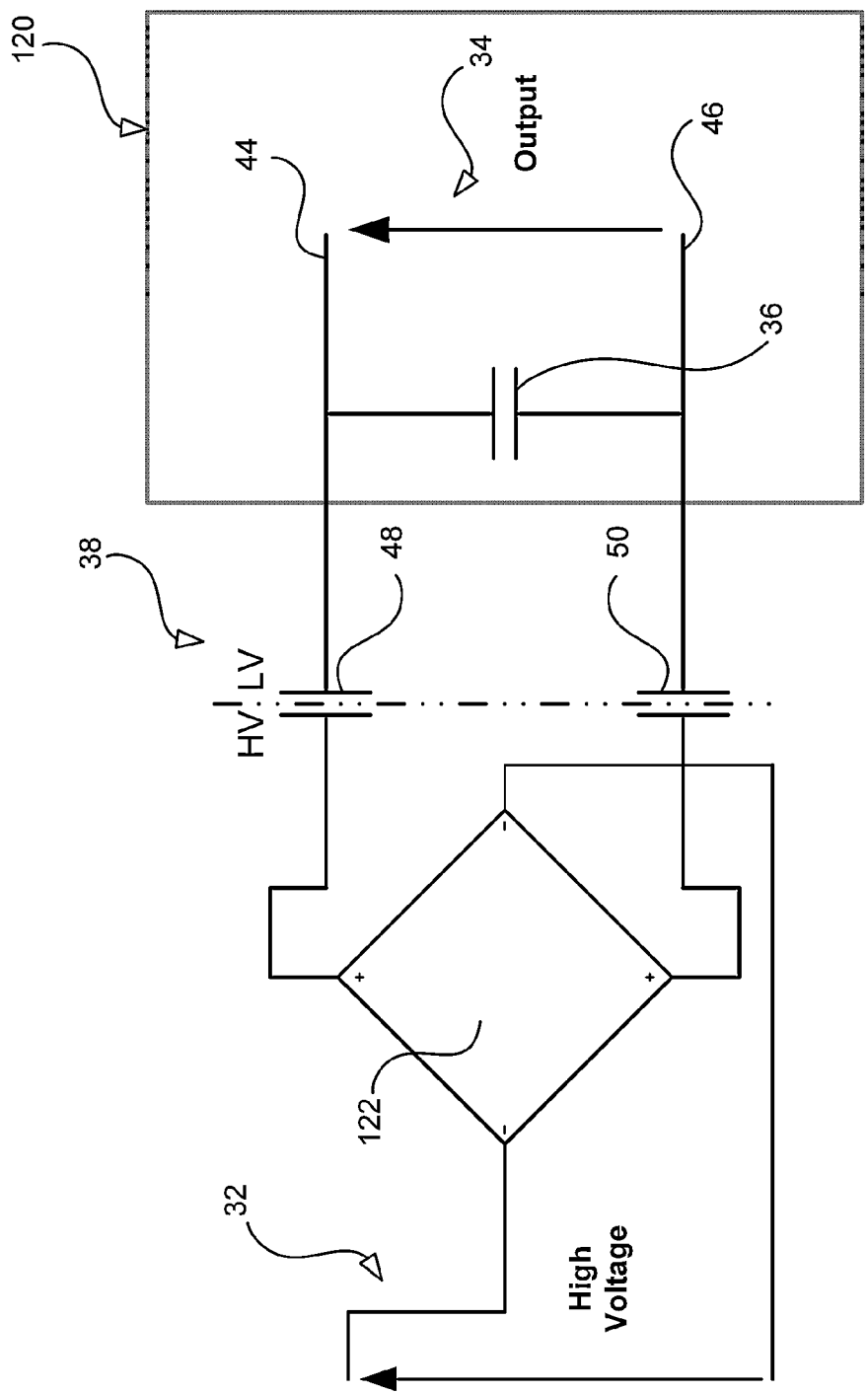
FIG. 6 is a circuit diagram of a voltage measurement circuit having a second form of input stage.
Figure 7:
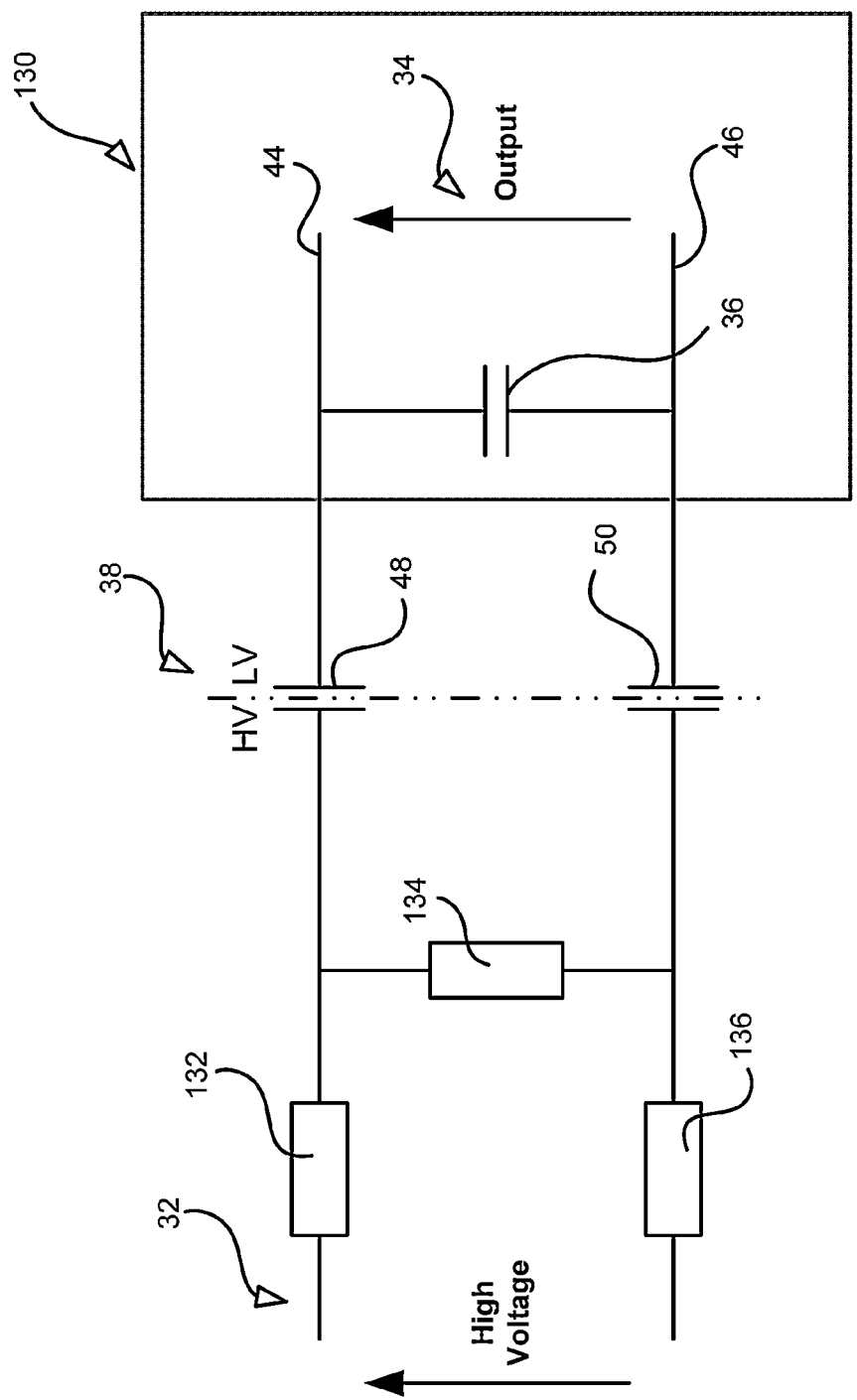
FIG. 7 is a circuit diagram of a voltage measurement circuit having a third form of input stage.

FIGS. 5 to 7 are circuit diagrams illustrating a voltage measurement circuit constructed according to the present invention having three different forms of input stage. Components in common with the circuit of FIG. 2 are identified with common reference numerals. The reader's attention is directed to the description given with reference to FIG. 2 for a description of the form and function of such components. The circuit 110 of FIG. 5 includes a diode 112 in series with the first capacitor 48, the diode being operative as a rectifier. The circuit 120 of FIG. 6 includes a bridge rectifier 122 between the input connections of the input stage 32 and the first and second capacitors 48, 50. The bridge rectifier 122 is operative to full wave rectify the domestic mains signal applied to the input stage. The circuit 130 of FIG. 7 includes a resistive divider formed of series connected first 132, second 134 and third 136 resistors. The first plates of each of the first and second capacitors 48, 50 are connected to opposing ends of the second resistance 134 to thereby provide an attenuated form of the domestic mains voltage signal to the first and second capacitors. The values of the first 132, second 134 and third 136 resistors are chosen depending on the level of the domestic mains voltage signal and the voltage level desired to be applied to the first and second capacitors.

Figure 8:
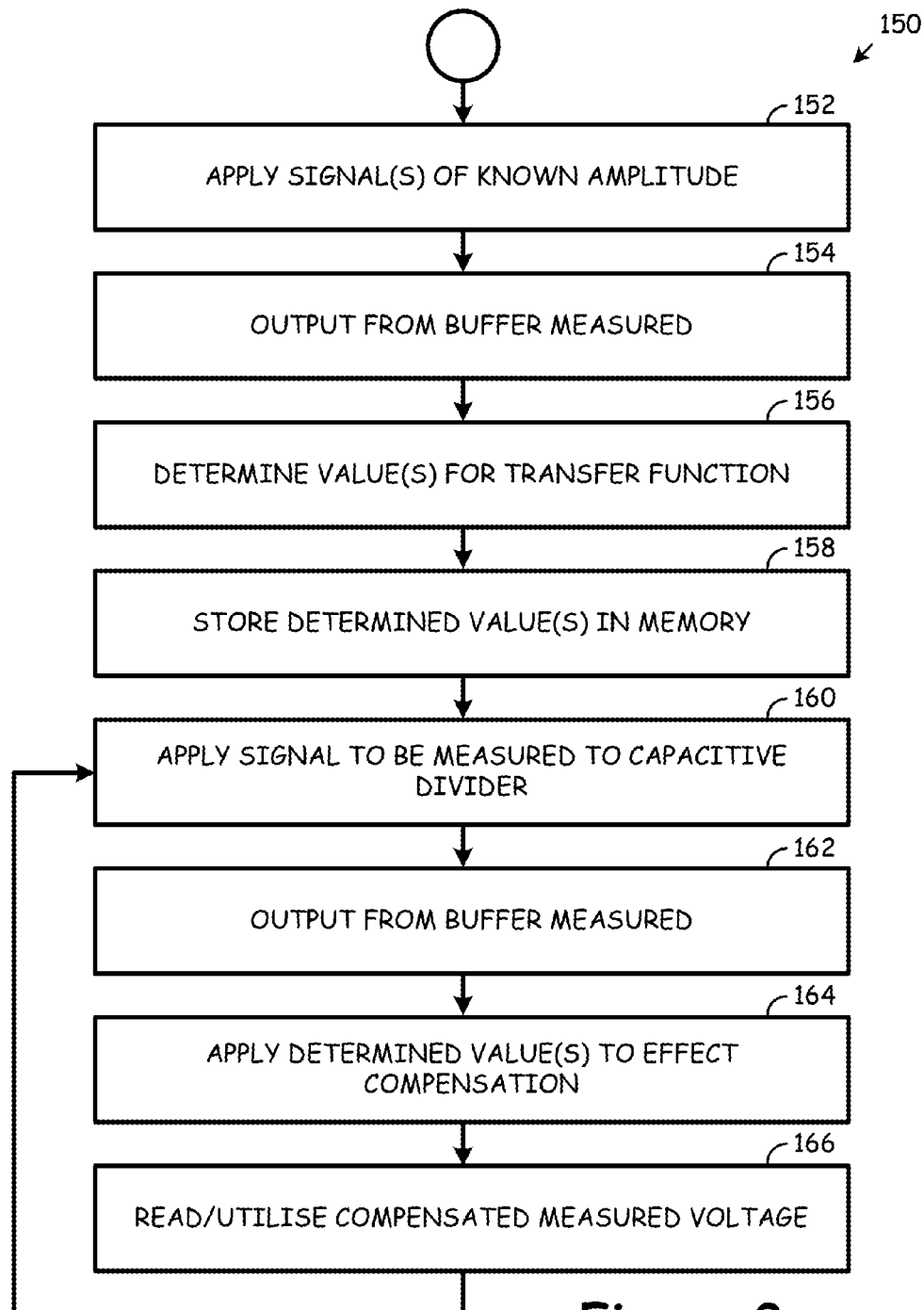
FIG. 8 is flow chart of a method of measuring a voltage signal according to the present invention.

FIG. 8 illustrates operation 150 of the voltage measurement circuit that was shown in FIGS. 1 to 7. A signal of known amplitude is applied 152 to the first and second inputs 12 to the capacitive divider 14. In the present example, the signal of known amplitude is about 230 Vrms, i.e. the maximum input voltage. The voltage signal developed across the third capacitor 36 is measured 154 by the analogue to digital converter 18 to provide a digital representation of the measured voltage. Next the amplitude of the digital representation of the measured voltage is compared with the known amplitude and a gain value (which constitutes a value for a transfer function) determined 156 that would change the digital representation of the measured voltage such that its amplitude corresponds substantially to the known amplitude. The gain value is determined by the microprocessor, which is operative in accordance with well known firmware design approaches. The gain value is then stored 158 in the one time programmable memory 24. This concludes the calibration phase of the method. Thereafter, the voltage measurement circuit is used to measure high voltage AC signals with a high voltage AC signal being applied 160 to the first and second inputs 12 of the capacitive divider 14. The voltage signal developed across the third capacitor 36 is measured 162 by the analogue to digital converter 18 to provide a digital representation of the measured voltage 162. Then the multiplier of the digital multiplier and adder circuit 26 is operative to multiply the digital representation of the measured voltage with the gain value stored in the one time programmable memory 24, 164. Hence, the output 28 from the digital multiplier and adder circuit 26 constitutes a measured voltage that has been compensated to take account of inaccuracies, such as those that have arisen from a departure of the actual capacitance values of the first to third capacitors from desired, ideal values. The compensated measured voltage is then read or otherwise utilised 166. Thereafter the measurement phase consisting of method steps 160 to 166 are repeated for subsequent measurement of high voltage AC signals.

In another form of the method described in the immediately preceding paragraph, two signals of known but different amplitude are applied 152 to the first and second inputs 12 to the capacitive divider 14. One of the signals is about 230 Vrms, i.e. the maximum input voltage, and the other is substantially 0 Vrms. The voltage signal developed across the third capacitor 36 for each of the two applied known voltage signals is measured 154 by the analogue to digital converter 18 to provide first and second digital representations of the measured voltages. Next the amplitude of the first and second digital representations of the measured voltages are compared with the known amplitudes and a gain value and an offset value (which constitutes values for a transfer function) determined 156 that would change the digital representation of each measured voltage such that its amplitude corresponds substantially to the known amplitude. The gain and offset values are then stored 158 in the one time programmable memory 24 to thereby conclude the calibration phase of the method. Thereafter and as described above, the voltage measurement circuit is used to measure actual high voltage AC signals with the gain and offset values being applied to compensate the measure voltages. According to the present form of the method, the adder of the digital multiplier and adder circuit 26 is operative to apply the offset value and the multiplier of the digital multiplier and adder circuit 26 is used to apply the gain value. In yet another form of the method described in the immediately preceding paragraph, three or more signals of known but different amplitude are applied 152 to the first and second inputs 12 to the capacitive divider 14. The voltage signal developed across the third capacitor 36 for each of the three or more applied known voltage signals is measured 154 by the analogue to digital converter 18 to provide three or more corresponding digital representations of the measured voltages. Thereafter the microprocessor is operative to determine a second or higher degree of polynomial to be applied to compensate measured high voltage AC signals. Such a second or higher degree of polynomial can be used to provide for correction of offset, gain and non-linearity. Three or more applied known voltage signals may also be used for a first degree polynomial (i.e. as described in the immediately preceding paragraph) to improve the accuracy of the coefficients, e.g. to address inaccuracies arising from noise in the reference signal. When the calibration phase is complete, the voltage measurement circuit is used as described above to measure actual high voltage AC signals. In this form of the method, the multiplier of the digital multiplier and adder circuit 26 is operative to multiply the digital representation of the measured voltage with itself the requisite number of times to determine a particular term of the polynomial. For example, in a second degree polynomial the digital representation of the measured voltage is multiplied with itself once to determine the second degree term of the polynomial. Otherwise, a zero order term is applied as an offset and coefficients for first and higher order terms are applied as gains as described above. The temporary working memory 22 in the microprocessor is used to store terms of a polynomial before the terms are added to each other to provide a compensated measured voltage signal.

In another form of capacitive divider circuit, instead of the printed circuit formed capacitors described above, class X and/or class Y discrete capacitors are used for the first and second capacitors and a ceramic capacitor is used for the third capacitor. The capacitance of the first to third capacitors is as described above with reference to FIG. 2.

The terms "circuit" and "circuitry" as used herein may refer to an independent circuit or to a portion of a multifunctional circuit that performs multiple underlying functions. For example, depending on the embodiment, processing circuitry may be implemented as a single chip processor or as a plurality of processing chips. Likewise, a first circuit and a second circuit may be combined in one embodiment into a single circuit or, in another embodiment, operate independently perhaps in separate chips. The term "chip," as used herein, refers to an integrated circuit. Circuits and circuitry may include general or specific purpose hardware, or may include such hardware and associated software such as firmware or object code.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description.

Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to."

As may even further be used herein, the term "operable to" indicates that an item includes one or more of power connections, input(s), output(s), etc., to perform one or more its corresponding functions and may further include inferred coupling to one or more other items. As may still further be used herein, the term "associated with," includes direct and/or indirect coupling of separate items and/or one item being embedded within another item. As may be used herein, the term "compares favorably," indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

The invention claimed is:

1. A method for measuring a high voltage AC signal comprising:
    applying a known voltage signal at an input of a capacitive divider circuit;
    measuring a voltage at an output of the capacitive divider circuit;
    determining a transfer function of a compensator circuit based upon relative, ideal impedances of capacitors of the capacitive divider circuit to alter the measured voltage such that it corresponds to a desired voltage;
    configuring the compensator circuit with the determined transfer function; and
    measuring a high voltage AC signal such that the compensator circuit is configured to change a voltage received at its input using the determined transfer function to provide a changed voltage at its output.

2. The method of claim 1, further comprising determining the transfer function in dependence on solely one applied known voltage.

3. The method of claim 1, further comprising determining the transfer function in dependence on two applied known voltages of different levels.

4. The method of claim 1, further comprising determining the transfer function in dependence on more than two applied known voltages of different levels and respective corresponding measurements.

5. The method of claim 1, further comprising operating the capacitive divider circuit as a DC isolator.

6. The method of claim 1, further comprising storing at least one value for the transfer function in a storage device.

7. A voltage measurement circuit configured to measure a high voltage AC signal comprising:
    a capacitive divider circuit including:
        first and second inputs configured to receive a high voltage AC signal; and
        first and second capacitors having first plates coupled to the first and second inputs, respectively; and
        a third capacitor coupled across second plates of the first and second capacitors, each of the first, second and third capacitors formed in a printed circuit board; and a compensator circuit having a configurable transfer function including:
    an input electrically connected across the third capacitor; and
    an output, the compensator circuit being configured to change a voltage received at its input in accordance with the configurable transfer function to provide the changed voltage at its output.

8. The voltage measurement circuit of claim 7, wherein the capacitive divider circuit is configured to operate as a DC isolator.

9. The voltage measurement circuit of claim 8, wherein the DC isolator further includes at least one of a parasitic impedance and an impedance provided by a discrete component.

10. The voltage measurement circuit of any claim 7, wherein the voltage measurement circuit comprises a differential active circuit.

11. The voltage measurement circuit of claim 10, wherein the differential active circuit includes at least one of a buffer and an amplifier.

12. The voltage measurement circuit of claim 7, wherein the compensator circuit includes an analog to digital converter configured to convert a voltage measured across the third capacitor to a digital signal.

13. The voltage measurement circuit of claim 12, wherein the compensator circuit includes digital processing circuitry configured to determine the transfer function in dependence on at least one applied known voltage and a corresponding voltage measured across the third capacitor.

14. The voltage measurement circuit of any claim 7, wherein the compensator circuit includes at least one of a digital adder and a digital multiplier, with the digital adder being configured to receive a digital form of the measured voltage and to add an offset value to the digital measured voltage to thereby effect correction and the digital multiplier being configured to receive a digital form of the measured voltage and to multiply the digital measured voltage with a gain value to thereby effect correction.

15. The voltage measurement circuit of claim 7, wherein a plate of at least one of the first, second and third capacitors is defined by a layer of metal in or on the printed circuit board.

16. The voltage measurement circuit of claim 15, wherein first and second plates of a capacitor are formed on opposing upper and lower surfaces of the printed circuit board such that the non-conducting body of the printed circuit board constitutes the dielectric of the capacitor.

17. The voltage measurement circuit of claim 15, wherein first and second plates of a capacitor are formed within the printed circuit board such that they are spaced apart from each other and with their footprints overlapping, whereby a non-conducting part of the printed circuit board between the first and second plates constitutes the dielectric of the capacitor.

18. The voltage measurement circuit of claim 7, wherein the third capacitor includes at least in part a discrete capacitor.

19. The voltage measurement circuit of claim 7, wherein the third capacitor is a parasitic capacitance.

20. The voltage measurement circuit of claim 7, wherein the voltage measurement circuit further includes a rectification circuit is configured to rectify a high voltage AC signal before it reaches the capacitive divider.

* * * * *